United States Patent [19]

Young et al.

[11] Patent Number: 4,870,357
[45] Date of Patent: Sep. 26, 1989

[54] LCD ERROR DETECTION SYSTEM

[75] Inventors: Steve Young, Milpitas, Calif.; Nigel Foster, Brookline, Mass.

[73] Assignee: Apple Computer, Inc., Cupertino, Calif.

[21] Appl. No.: 202,875

[22] Filed: Jun. 3, 1988

[51] Int. Cl.⁴ ............................................. G01R 31/02
[52] U.S. Cl. ................................. 324/158 R; 358/106
[58] Field of Search ............ 324/158 R, 158 D, 73 R; 358/106, 107, 139; 356/237; 382/34; 250/492.2

[56] References Cited

U.S. PATENT DOCUMENTS 4,589,139  5/1986  Hada et al. ........................... 358/107

FOREIGN PATENT DOCUMENTS

0073140  3/1983  European Pat. Off. .............. 382/22

Primary Examiner—Reinhard J. Eisenzopf
Assistant Examiner—Edward F. Urban
Attorney, Agent, or Firm—Blakely, Sokoloff, Taylor & Zafman

[57] ABSTRACT

The present invention is an error detection system for liquid crystal display (LCD) devices. The system comprises a photo-scanning device coupled to a computer and a LCD display driver. Faulty LCD cells are detected by using the photo-scanner to produce two images. The first image is produced by displaying a predetermined pattern on the LCD device. This pattern is inverted to produce the second image. By analyzing these two images, faulty LCD cells are located. The results of the analysis give the location of the faulty LCD cells.

9 Claims, 4 Drawing Sheets

FIG_1

FIG_2

LCD ERROR DETECTION SYSTEM

BACKGROUND OF THE INVENTION

1. The Field of the Invention.

The present invention relates to an error detection system and more particularly to a liquid crystal display (LCD) error detection system for inspecting LCD display screens and detecting the faulty LCD cells.

2. Prior Art.

LCD devices are used as a display element of a variety of electrical systems. Recently, the ability to produce LCDs in pixel sized cells as part of a larger array has been achieved. This has resulted in LCD devices having tens of thousands of LCD pixel cells in a matrixed array that can perform as a computer monitor. However, the smaller size and increased number of cells creates a greater number of faulty LCD cells. Having even a small percentage of faulty cells can significantly impair the functionality of an LCD device, such as an LCD display screen.

LCD cells are well known in the art. A typical LCD cell comprises two plates having liquid crystals between them. When a sufficient voltage difference between the two plates exists, the liquid crystals organize into a structure that allows light to pass through the LCD cell. Without a voltage differential, the liquid crystals organize into a structure that makes the LCD cell opaque. Thus the relative voltage potential of the two plates determine whether the LCD cell becomes transparent.

LCD devices are well known in the art. A typical LCD device comprises rows and columns of LCD cells configured in a matrixed array. One of the two plates of every LCD cell is coupled to a common line. The second plate is coupled to a switchable voltage source. By changing the second plate's voltage the transparency of the LCD cell is changed. Manufacture of the LCD device can result in several types of errors. Some errors address the overall performance of the device, such as contrast, cross talk, purity, response time, and image memory. Other errors relate to particular errors in the LCD cell construction, identified as Types I, II, and III errors.

Contrast is the difference in light intensity between the LCD cells in their transparent state and their opaque state. Ideally, an LCD device has a uniform contrast level because all the LCD cells of the device are similarly constructed. By testing a small sample of cells the contrast level is determined. A certain minimum contrast level is necessary to allow a LCD device to perform as a computer monitor.

Cross talk errors relate to areas adjacent to opaque regions of the screen. Normally, transparent LCD cells directly adjacent to opaque cells should have as great an intensity as transparent LCD cells not adjacent to an opaque cell. However, a common problem in LCD devices is that "ghost" regions appear around the opaque region. These ghost regions are less transparent than the average transparent LCD cell and thus appear gray.

Purity is defined by the uniformness of intensity over the entire LCD device. Ideally, an LCD device should have a uniform intensity level since the LCD cells of the device are similarly constructed. However in reality some LCD devices have a substantial number of dissimilar LCD cells. When different regions have differing intensity levels, the device is impure. Absolute purity is defined as every LCD cell having the same intensity throughout the array. Although absolute purity is impossible as a practical matter, a sufficiently high purity is necessary for device performance.

Image memory refers to the phenomena of a prior image's "ghost" appearing on the screen. The image memory lies in the length of time a prior image was displayed. The voltages present on the two plates of the LCD cell cause the phenomena by altering the structure and orientation of the liquid crystals between the plates. Image memory can be identified either as faulty pixels or as impure areas, depending on the severity.

Type I LCD cell errors involve two adjacent LCD cells that have a common liquid crystal region. Improper separation of the two liquid crystal regions due to faulty construction results in a Type 1 error. A Type I error allows both LCD cells to become transparent. To correct a Type I error, the two liquid crystal regions must be separated so that a voltage difference in one cell does not affect the other LCD cell.

Type II LCD cell errors involve an LCD cell and its adjacent line being electrically coupled. Faulty construction by allowing a liquid crystal region to border an active line allows this type of error. A type II error causes the LCD cell to be permanently opaque. To correct a Type II error, the liquid crystal region must be electrically isolated from the active line.

Type III errors involve the connection of a LCD cell to an active line. This occurs because the connection has shorted out, causing the LCD cell to be permanently opaque. It is not presently practicable to repair this type of error. However, if having the LCD cell permanently transparent is preferable to having it permanently opaque, the connective line can be severed to turn the LCD cell into a permanently transparent cell.

An LCD structure and method for fault testing in LCD devices is described in U.S. Pat. No. 4,734,688 (Adams). The device in Adams has two different signals applied to each LCD cell. The first signal is the normal control signal and operates at a set frequency. The second signal is a checking signal and operates at half the frequency of the first signal. During normal operation of an LCD cell, the first signal controls the operation of the cell. This results in the cell appearing transparent when the cell is activated by a voltage difference. If the first signal stops then the cell is activated, the second signal causes the cell to be transparent at half the rate of the first signal. This results in the LCD cell appearing to blink.

There are several limitations to the device and method described in Adams. The Adams device tests only the drive signal. One problem is the device involves a combination of larger seven cell LCD character displays. The Adams device requires additional circuitry to provide two signals to each cell. The additional circuitry would require more space to install in LCD screens. Another problem is that the faulty cell must be activated by the second signal to blink. If the second signal also fails, then the faulty cell will not blink. Also, the Adams device and method does not have the ability to detect type I, II, or III errors. Furthermore, the Adams device and method only identify errors in already functioning devices.

In scanning an LCD device, aliasing may introduce errors. Aliasing refers to a phenomena that occurs when the ratio of sensors to objects (which are to be sensed) is not a whole number. Lacking a one-to-one direct correspondence a chance exists that an object will escape detection when it lies between two sensors. To avoid aliasing, the ratio of sensors to objects should be a whole number or sufficiently close.

What is needed in the art is an LCD error detection system that can inspect an LCD display screen and detect faulty LCD cells. Also what is needed is an LCD error detection system that can test for contrast, cross talk, purity, response time, and image memory of LCD display screens. One object of the present invention is to provide an error detection system to inspect and detect faulty LCD cells. Another object of the present invention is to provide a system that can test screen parameters.

SUMMARY OF THE INVENTION

The present invention is a system for error detection in LCD devices. The system's equipment comprises an optical scanning device coupled to a computer that has image processing and error detection software, with an LCD display driver. The system's process comprises scanning and analyzing steps. First, an optical scanner scans the LCD device to produce an electronically storable first and second image, the second image being the inverse of the first. All images include intensity values that are associated with every cell of the LCD device. Then, a third image is created by summing the first and second image. Faulty LCD cells are located by analyzing those three images. Finally, the results of the analysis are output to identify the defective LCD cells' location.

DETAILED DESCRIPTION OF THE PRESENT INVENTION

The present invention describes a liquid crystal display (LCD) device error detection system. In the following description, numerous specific details are set forth in order to provide a thorough understanding of the present invention. It will be obvious, however, to one skilled in the art that the present invention may be practiced without using these specific details. In other instances, well-known methods and structures have not been described in detail so as not to unnecessarily obscure the present invention.

The present invention uses visual image scanning and computer image analysis to identify faulty LCD cells in an LCD device. A scanning device similar to a facsimile machine is used to scan the LCD device and produce an electronically storable image. The image is comprised of pixel data, with each pixel data element having an intensity value giving a measure of light intensity measured at the particular position in the image. Black and white (or monochrome) LCD devices have an intensity value, indicating the shade of gray. For color LCD devices, the intensity value will have three components indicating the shade of the three primary colors (red, green and blue).

After scanning, a computer then processes scan images. The first step in processing the scan image is to balance it. Balancing an image involves adjusting the intensity of pixels so a standardized contrast value appears from an image. Specifically, the difference between the highest and lowest intensity values is adjusted to a predetermined constant. With this information, the scan image is normalized. The step of balancing is not absolutely essential to detect faulty LCD cells, but it greatly facilitates the further analysis.

Next, the location of faulty LCD cells is determined. A third image is created by summing the gray values of corresponding positions in the scan image and the inverted image. Analysis involving these three images determines the location of faulty LCD cells, using methods including thresholding and connectively analysis.

Finally, the system outputs the results of the analysis. The results are stored on a permanent storage file. The file has the locations of the defective LCD cells so they can be located and dealt with. The system also provides a user interface, whereby a user can manipulate the images and view the results on the computer.

Figure 1:
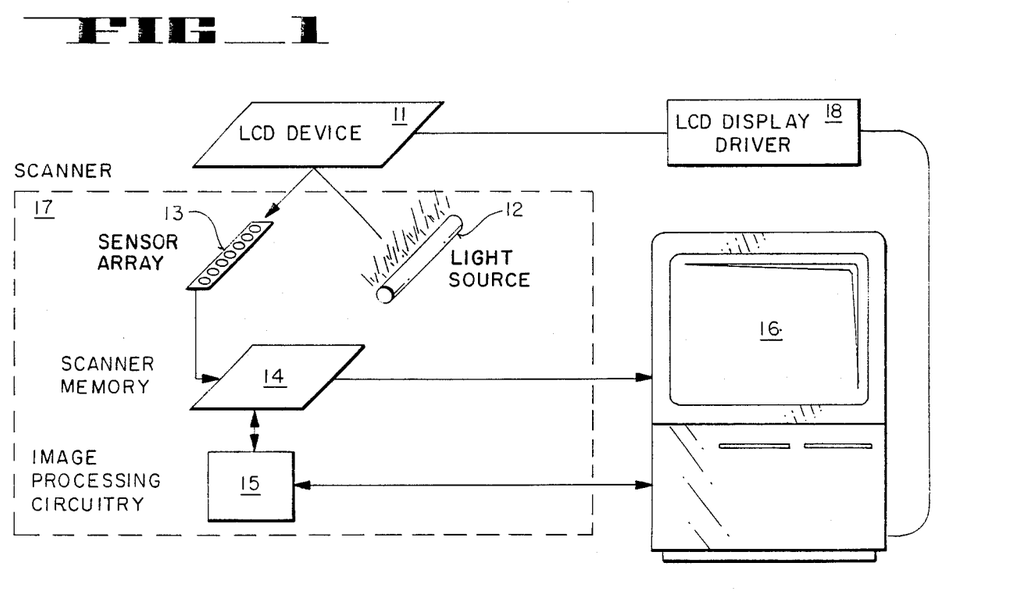
FIG. 1 is a schematic diagram of the LCD error detection system of the present invention.

The configuration of the physical components of the LCD error detection system of the present invention is shown in FIG. 1. To test LCD device 11, it must be placed on scanner 17. Scanner 17 is coupled to host computer 16, whereby scanner 17 sends images to host computer 16 and also allows commands and parameters to be communicated between the two. The preferred embodiment uses a modified Apple ® scanner on which to mount LCD device 11.

According to information theory, at least two sensors should exist for every one object to be identified by a sample. Also, to eliminate aliasing problems, the number of sensors should be a multiple of the number of objects to be identified. These teachings dictate that the LCD device should be placed at a position were the ratio of sensors to LCD cells is a whole number greater or equal to two. In the preferred embodiment the ratio of 4 is used. The glass plate is removed from the scanner and a cover is placed such that the LCD device is raised approximately one eighth of an inch from where the bottom of the glass plate rested. This positions the LCD device 11 so the proper distance is maintained from sensor array 13. Also, glass is a significant collector of dust, and by removing this source of dust the clarity of the scan images is greatly improved.

Coupled to both LCD device 11 and host computer 16 is LCD display driver 18. In the preferred embodiment, the LCD display driver 18 is a computer. The LCD display driver 18 communicates with the host computer 16 to determine what pattern to display on LCD device 11. After instructed by host computer 16, LCD display driver 18 operates LCD device 11 so it presents appropriate patterns. It would be obvious, however, to one skilled in the art that LCD display driver 18 could be a dedicated circuit to perform the aforementioned functions, or those functions could even be performed by a sufficiently powerful host computer 16. Thus, a separate LCD display driver 18 is not essential to practice the present invention.

Scanner 17 comprises light source 12, sensor array 13, scanner memory 14, and image processing circuitry 15. The light source 12 works in combination with sensor array 13 to generate an image. The light source 12 emits light that strikes LCD device 11 and reflects to sensor array 13. The intensity of the light that appears to sensor array 13 determines the gray value at the corresponding position of the image. Sensor array 13 is coupled to scanner memory 14 such that the pixel data from sensor array 13 is electronically stored in scanner memory 14. Scanner memory 14 is also coupled to host computer 16 so that it can send its image to host computer 16 for processing. Image processing circuitry 15 is coupled to scanner memory 14 to perform some image processing, including tasks such as contrasting and thresholding. Many image processing tasks can be handled more efficiently by small dedicated circuits, compared to having the host computer 16 spend execution time performing those same tasks. However, the image processing circuitry 15 can be omitted entirely, but this results in longer processing time for host computer 16. Image processing circuitry 15 is coupled to host computer 16 so that the processing of the image can be coordinated between host computer 16 and scanner 17.

In the preferred embodiment, four sensors scan each cell of the LCD device on each line, for a total of 16 sensors per LCD cell. This four-to-one LCD cell to sensor corresponds to the number of sensors and LCD cells per line. The distance between the LCD device and the sensor array is also factored into the calculation. Therefore, by correctly gauging the distance between the two, an exact magnification results, in the preferred embodiment this is a x4 magnification.

Each scan pixel received by a sensor comprises four bits, and the four bits can represent different values according to the mode of the scanner. The values range from 0 for pure white to a positive number for absolute black. For example, one mode of the scanner returns 0000 for 0% intensity, 0001 for 25% intensity, 0010 for 50% intensity, 0100 for 75% intensity, and 1000 for 100% intensity. A second mode returns 0000 for 0% intensity, 0001 for 25% intensity, 0011 for 50% intensity, 0111 for 75% intensity, and 1111 for 100% intensity. The second mode is preferable because numerically it emphasizes the difference between intensities better than the first example (e.g., at 50% intensity 3>2, at 75% intensity 7>4, and at 100% intensity 15>8). Most preferable would be to have the four bits represent 16 different intensity levels. However, speed and other performance considerations often warrant against such precision in scanning when the results of the scanning are successful. Also, scan pixels are much more precise than initial scan values when taken after balancing the images for a particular LCD device.

Figure 2:
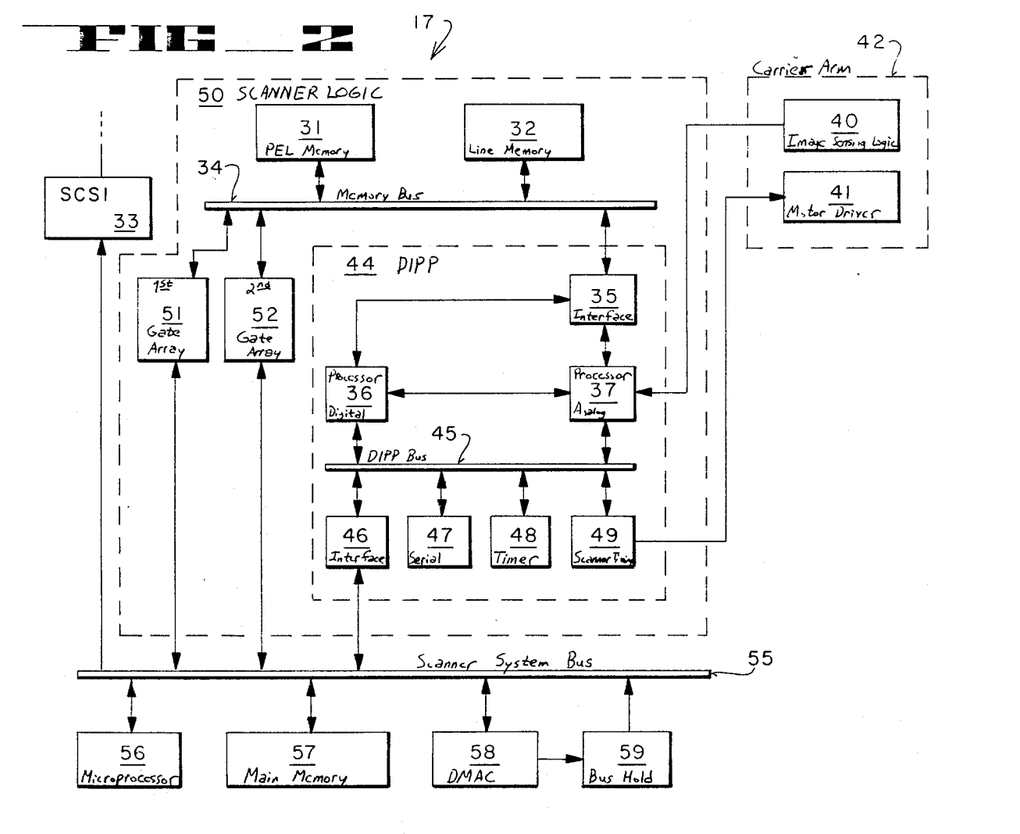
FIG. 2 is a block diagram of the scanner of the present invention.

A schematic block diagram of the circuitry of scanner 17 is shown in FIG. 2. Although scanner 17 is an Apple ® Scanner in the preferred embodiment, any prior art scanner may be used. Carrier arm assembly 42 does the actual scanning. Carrier arm assembly 42 comprises image sensing logic 40 and carrier arm motor driver 41. Image sensing logic 40 comprises light source 12 and sensor array 13 as well as supporting circuitry. Carrier arm motor driver 41 is a mechanical device that guides the movement of image sensing logic 40 under the LCD device 11. To ensure that all of LCD device 11 is scanned, the movement of carrier arm assembly 42 must be carefully timed. Also, the sensor array 13 must be exposed to each LCD cell for an approximately equal period of time. Scanner logic 50 is coupled to the movement and receive sensor signals of the carrier arm assembly 42.

Scanner logic 50 has memory bus 34 which serves to couple scanner logic 50's components. Scanner logic 50 comprises PEL correction memory 31, line memory 32, first gate array 51, second gate array 52, and document image preprocessor (DIPP) 44. The DIPP 44 serves as a timer and an analog to digital converter. PEL correction memory 31 and line memory 32 serve to buffer data between carrier arm assembly 42 and main memory 57. Also, image correcting and other processing take place while data resides in PEL correction memory 31 and line memory 32. First gate array 51 and second gate array 52 provide various support functions for DIPP 44 and are coupled to scanner system bus 55.

DIPP 44 has its own DIPP internal bus 45. System bus interface 46 is coupled to scanner system bus 55 and DIPP internal bus 45, and mediates communication between DIPP 44 and scanner system bus 55. Serial interface 47 is coupled to DIPP internal bus 45, facilitating serial communication of the scanner 17's data. Timer 48 is coupled to DIPP internal bus 45, providing a timing signal to coordinate the actions of the various components of DIPP 44. Scanner timing generator 49 is coupled to DIPP internal bus 45 and to carrier arm motor driver 41, guiding carrier arm assembly 42 at a generally constant speed. Analog signal processing unit 37 is coupled to DIPP internal bus 45, image sensing logic 40 memory bus interface 35, and digital signal processing unit 36, receiving signals from image sensing logic 40, signals which are stabilized for conversion to digital signals. Digital signal processing unit 36 is coupled to memory bus interface 35, analog signal processing unit 37, and DIPP internal bus 45, converting analog signals to their digital equivalent. Memory bus interface 35 is coupled to memory bus 34, digital signal processing unit 36, and analog processing unit 37, facilitating transmission of data between memory bus 34 and DIPP 44.

Line memory 32 and PEL correction memory 31 are buffers between DIPP 44 and main memory 57. In the preferred embodiment, both are 2K byte random access memory (RAM) integrated circuits. Image correction and other processing occur in these buffer memories. The processing occurs line-by-line in the buffers, but the buffers can only hold a few scan lines of data at one time. Line memory 32 reduces the scanned image by storing a section of the image in line memory 32 and sends only a portion of the image to main memory 57. PEL correction memory 31 corrects any distortion of the data.

First gate array 51, coupled to memory bus 34 and scanner system bus 55, provides a number of help functions for DIPP 44, as well as implementing a reduction feature. Reduction results from diverting output destined for main memory 57 to line memory 32, then sending only a certain ratio of the scan lines to main memory 57. Other functions of first gate array 51 include address generation, memory control, bus interface, gray-scale horizontal-resolution conversion, which merges a series of gray values thereby reducing an image by combining sensor values.

Second gate array 52, coupled to memory bus 34 and scanner system bus 55, also provides a number of help functions for DIPP 44. These functions include two-channel direct memory access control, bus arbitration, interrupt control, carrier motor control, address latch, and chip select control. The two-channel direct memory access control coordinates the storage of data in main memory 57. The carrier motor control aids in the control of the controlling carrier arm assembly 41.

Microprocessor logic 56 of scanner 17, controls the operation of the gate arrays 51 and 52, the DMAC 58, and carriage arm motor driver 41. Microprocessor logic 56 is coupled to scanner system bus 55 and comprises a processor circuit, RAM memory, an I/O port, a timing circuit, and an interrupt circuit. In the preferred embodiment, the processor circuit is a NEC 8-bit 7809 microprocessor, having a 12 MHz clock and 256 bytes of RAM. Also, the microprocessor logic 56 has a 8 MHz clock that supplies a timing signal to the second gate array 52. The 8 MHz clock's signal is divided to provide a 4 MHz signal to the DIPP 44, first gate array 51, and DMAC 58.

Main memory 57 stores images after processing by scanner logic 50, and is coupled to scanner system bus 55. In the preferred embodiment, main memory 57 comprises two 16K byte RAM and a 32K byte read only memory (ROM). The RAM memory buffers image data and stores parameters received from the host computer 16. Approximately 10K bytes of RAM function as a buffer between the observation of image data by image sensing logic 40 and transmitting that data to host computer 16. The ROM memory has firmware instructions to control the scanner 17.

DMAC (direct memory access control) 58 is coupled to scanner system bus 55 and bus hold watchdog timer 59. DMAC 58 coordinates the transmittal of data from main memory 57 through small computer standard interface (SCSI) 33 to host computer 33. Working in conjunction with microprocessor logic 56 the DMAC 58 can transmit approximately 5,000,000 bits per second.

Bus hold watchdog timer 59 is coupled to scanner system bus 55 and DMAC 58. By checking the status of scanner system bus 55, bus hold watchdog timer 9 sends signals to DMAC 58 regarding the current status of the scanner system bus 55. Thus, bus hold watchdog timer 59 acts as a bus arbitrator, mainly to allow DMAC 58 to instruct main memory 57 to send information by SCSI interface 33 to host computer 16.

SCSI 33 is a type of communication line that is well known in the art. Thus, scanner 17 transmits image data to host computer 16. It should be noted that many of the operations of scanner 17 could be accomplished, though less efficiently, by host computer 16. Therefore many variations of dividing processing tasks between the scanner's circuitry and the host computer are within the spirit and scope of the present invention.

Also, there are other devices equivalent, through less desirable, than the preferred embodiment's scanner. An alternative to using a facsimile scanner is the use of television cameras to scan the LCD device. Typically, six television cameras are needed to have sufficient sensors to reliably image the LCD device, the cameras are positioned as a 2×3 matrix above the LCD device. However, the actual number of cameras needed depends on the LCD device's size, the camera's resolution, and the camera's buffer size. Further, the actual arrangement may vary according to the size and shape of the LCD device. Images of the television cameras can be combined to form one electronically storable image similar to that provided by a facsimile scanner. Alternatively, each camera could provide a separate image to the host computer and it could link the images together. A number of difficulties warrants not using television cameras. One problem deals with the position and movement of the cameras. The cameras must be set securely so that almost no movement is possible, because the images produced by the cameras rely on the exact relative positions of the cameras. A slight movement can result in a cell being identified in an incorrect position, distorting the results. Additionally, vibration can alter the focus of the cameras, thus rendering the scan image worthless. Also, the software needed to coordinate the cameras and produce a suitable image is more complicated and time-consuming. However, one advantage of using television cameras is that the scanning device would be portable. A portable scanner could be used on LCD devices integrated with other physical components, components that might make mounting on the scanner of the preferred embodiment difficult or impossible. Another advantage of using television cameras is the improved speed of image generation over the scanner, which requires the carrier arm to physically move across the LCD device.

The host computer 16 of the preferred embodiment of the present invention is an Apple ® Macintosh TM computer. The host computer 16 must have sufficient memory to store the scan images and the calculated images, plus necessary program and data memory. The actual amount of memory required depends on the size of the LCD device and the desired resolution of the scan image. In the preferred embodiment, approximately 8 megabytes of memory adequately meets the storage requirements.

The process used with the scanner and computer of the present invention involves scanning the LCD device and performing a series of calculations on the data gathered by the scan. Scanning the LCD device produces electronically stored images which have intensity values associated with every pixel of the scan image. During preparation of the image, contrast and purity can be tested. Also, separate scans produce images to check for cross talk. Once an image is produced, the image is analyzed to determine the location of defective cells. Producing additional images derived from the scanned images facilitates the analysis, as well as thresholding the images. A connectivity analysis can also serve to locate faulty cells in the LCD device, first as the cross talk images can provide data for a cross talk analysis.

Figure 3:
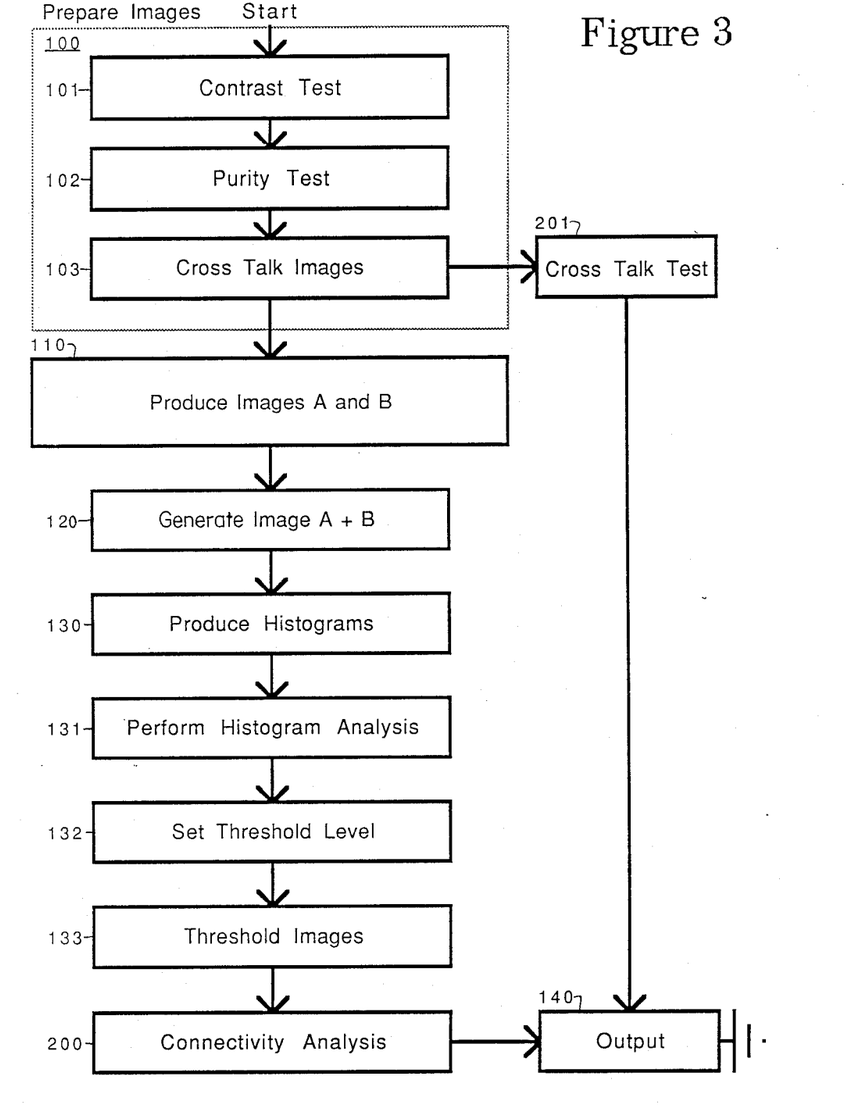
FIG. 3 is a flow chart diagram of the LCD screen analysis algorithm of the present invention.

FIG. 3 is a flow chart diagram of the LCD screen analysis algorithm of the preferred embodiment of the present invention. It will be obvious, however, to one skilled in the art that many variations in form and detail may be made within the teachings of this disclosure. The algorithm described in FIG. 3 shows an optimized process flow used with the system of the preferred embodiment. The use of other equipment, or production of results with a different level of confidence, would require modifications trivial to one skilled in the art.

Prepare Images 100 comprises three independent steps: Contrast Test 101, Purity Test 102, and Cross Talk Images 103. All three steps can occur before balancing the scan images. The first image displayed on the LCD device and scanned is a calibration screen that is used to orient the image. A set of calibration points appear as the first image, which in the preferred embodiment has two calibration points to orient the scan image in relation to the known locations of LCD cells. Contrast is then tested in Contrast Test 101 by comparing the intensity of the six points to the background. For example, the normal contrast could have white appear as approximately 7 and black appear as approximately 15. Based on the same image, purity is tested in Purity Test 102. Purity is determined by comparing the background intensities at various points in the image, limp with any deviation from the average background intensity indicates a purity error.

After displaying the calibration points, patterns needed to check for cross talk errors are displayed and scanned in Cross Talk Images 103. In Cross Talk Images 103, the LCD device displays a screen with (1) darkened rectangular regions having white crossing regions which lie on either a row or a column having a darkened region, and (2) background regions of the LCD device left white that do not lie on either the row or column lines of the darkened rectangle. In LCD devices, cross talk errors tend to occur over many rows generally as a result of faulty manufacture. The preferred embodiment of the present invention uses a cross talk pattern comprising darkened regions positioned approximately every other inch vertically and horizontally. Cross talk errors are detected by noting the intensity of white areas, located on the same row or column as a darkened area, comparing it to the intensity of the background. Also, the uniformity of cross talk can be determined by checking a number of cross regions. Since background regions are necessary, the use of only one cross talk pattern cannot check every row and column line. Therefore, to completely check all row and column lines for cross talk errors, two cross talk patterns must be displayed. At this point all the necessary information for step 201, Cross Talk Test, is available. Cross Talk Test 201 is discussed in further detail below.

After the initial images are scanned in Prepare Images 100, the scanner conducts two additional scans, producing images A and B. Image A is taken with the LCD device displaying a checkerboard pattern. For example, a checkerboard pattern has as its first row, LCD pixels in the following states: on-off-on-off-etc.; and as its second row, LCD pixels in the following states: off-on-off-on-etc. Image B also uses a checkerboard pattern that is the inverse of the pattern of image A. Using the previous example of image A's pattern, image B would have a first row pattern of off-on-off-on-etc. After an image is prepared in step 100, an image forms in Produce Images A and B 110. This Produce Images A and B 110 step constructs two electronically storable images, A and B, from the data observed and processed in the Prepare Image 100 step. In the preferred embodiment, an image is a matrix of pixel data elements, each pixel data elements comprising four bits to signify the intensity observed at that point. It would be obvious, however, to have a greater or lesser number of bits for each pixel data element, or for each pixel element to comprise intensity levels for the colors of the display.

In the preferred embodiment, images A and B are balanced so that each image has a normal contrast. Balancing provides images that are easier to threshold for the identification of. Typically, balancing is done only for the first LCD device tested. For subsequent tests, the balancing from the first test is used. In this manner, gradual variations in LCD devices from a production line can be monitored by comparing the first LCD device's intensity levels with subsequent devices. If balancing were done for every LCD device, the scan images would always be well-balanced but any change from the intensity of the first LCD device would not be noted.

After producing images A and B, the process continues with Generate Images 120. Generate Images 120 produces a third image. The third image, image A and B, is an image formed by performing a matrix addition with images A and B. Typically, image A+B has a background that is approximately 22 in value. LCD pixels that are permanently black, or black in both images, appear as intensity values of approximately 30.

After production of all the relevant images, analysis begins. In the preferred embodiment a thresholding scheme is used to minimize process time. This thresholding scheme uses histograms to select a threshold level, thus producing thresholded images easier to analyze. First, at Produce Histogram 130 the number of instances of each intensity level of image A and B is tabulated. This produce raw the data necessary to generate a histogram, either as an internal representation or graphically displayed on a computer terminal. Next, at Perform Histogram analysis 131, the raw data produced at step 130 is analyzed. On the basis of the analysis, a specific threshold level is selected at the step, Set Threshold Level 132. Once a threshold level selected, Threshold Images 133 enables the thresholding process. After thresholding, Connectivity Analysis 200 conducts a connectivity analysis on the image to locate the regions of the LCD device having faulty LCD cells. The output 140 presents the test results to the user, as well as allowing inspection and modification of the thresholding of each image. Both Connectivity Analysis 200 and Output 140 are discussed in further detail below.

Figure 4:
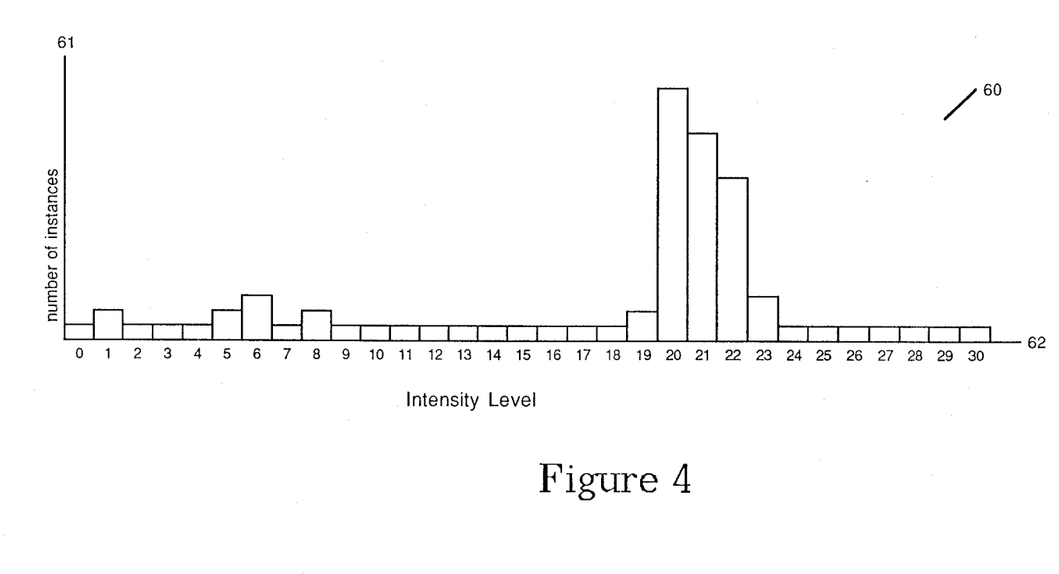
FIG. 4 is a histogram illustrative of those used by the present invention.

FIG. 4 shows an example of a histogram that is generated in the present invention. Histogram 60 has X-axis 62, that represents intensity level, and Y-axis 61, that indicates the number of occurrences. This hypothetical A and B image has intensity levels from O to 30, since the preferred embodiment represents intensity levels with 4 bits, that correspond to the numbers 0 to 15. Thus, a sum of two intensity levels could range from 0 to 30. The actual numbers in histogram 60 depend on the size of the LCD device. In FIG. 4, a reasonable threshold level would be 22, 23, or 24, depending on the thoroughness desired. Thus, a relatively small number of pixels would remain after thresholding an image, allowing for easier detection of faulty cells. Factors to consider when selecting a threshold level include the degree of precision necessary to reliably identify faulty cells, the expected distribution for the LCD device being tested, and the type of error sought. Thresholding can be done by filtering intensity values either above or below the threshold value, as well as by selecting a range or even a single intensity value to display. Thus, examples of thresholding include showing only those positions having an intensity of 24 or higher, showing only those positions having an intensity of below 4, showing only those positions having intensities between 7 and 16, or showing only those positions having an intensity of 6.

After thresholding, the image becomes a bit map wherein the thresholded pixels are "0" and the non-thresholded pixels are "1", or vice versa. The bit map can be stored as the original image, with "0" being represented by binary 000 . . . and "1" by any binary string containing a "1". Alternately, the image can be compacted by storing it as actual 1's and 0's. In either case, the connectivity analysis considers the image as if it was a bit map.

Connectivity analysis is a method well known in the art of image processing. It is a method of processing a binary image that comprises variously sized visual objects. Its basic algorithm scans the image from left to right, top to bottom and creates records about the objects. An object is defined as a contiguous region of pixels having the same value. In connectivity analysis, the objects are termed "blobs". A "blob" is a contiguous collection of scan pixels having the same intensity, and each blob indicates a region of the LCD device potentially having faulty cells. By convention, the image is considered to have 0's bordering the bit map image, and any blob of 0's touching a border is considered a part of this hypothetical surrounding blob.

The connectivity algorithm begins in the upper left hand corner of the image (although it could start in any corner). A common way of scanning through an image uses a $2\times 2$ matrix that is compared to the current location. Each line is processed by checking the $2\times 2$ matrix having the current location as the upper left hand corner of the matrix. Certain patterns indicate that a new blob exists, others indicate a continuing blob, while others indicate the two blobs are really parts of the same one. If a 1 appears where only 0's were before (or vice versa), a new record is created for the newly discovered blob. If an extension of a blob is noted by a continuing series of 1's (or 0's depending on the blob type), then stored information about the blob updated. If a series of 1's (or 0's) appears and links two separate blobs having 1's (or 0's) then the previous two blobs are really parts of the same integrated blob. In this case, the two previous blob records are merged reflecting the current data of the integrated blob.

A hierarchial arrangement also exists among the blobs of an image. The surrounding blob of hypothetical 0's is the parent of all of the 1's blobs. A parent is defined as a blob that completely surrounds the borders of another blob, which is termed its child. A sibling relationship exists between blobs having the same parent. The hierarchial relations of parent/child, and additionally of siblings, are stored as pointers between blob records.

Numerous variations on the connectivity algorithm work well with the present invention. The preferred embodiment uses a connectivity algorithm which defines the hypothetical bordering pixels as 0's comprising blob 0. Run length coding is used to process the image's lines. White blobs (1's) are defined by 4-connectivity and black blobs (0's) are defined by 8-connectivity. However, it would be obvious to one skilled in the art that many variations in form and detail of the connectivity analysis can be made within the scope and spirit of the present invention.

The Connectivity analysis is conducted by host computer 16 in the preferred embodiment and comprises locating "blobs" in a thresholded image. For each blob encountered, the LCD error detection system collects the following information:
 Area
 X center of gravity
 Y center of gravity
 Perimeter
 Theta rotational value
 First pixel
 Minimum pixel
 Maximum pixel
 Horizontal width
 Vertical width
 Corners
 Children
 Siblings Area refers to the size of the region presented by the blob that is measured by the number of pixels X. Center of gravity and Y center of gravity represent the X and Y coordinates, respectively, of the center of gravity of the blob. Perimeter is a lengthwise measure of the blob's sides. Every blob is represented by scan pixels in a coordinate plane, although its true shape may be curvilinear. The perimeter value estimates the blob's actual curvilinear perimeter and gives the best results when the blob is a circle. The calculation is done by adding together the number of vertical and horizontal border pixels, then subtracting an amount based on the number of corners, to arrive at the final perimeter value.

The next six pieces of information concern the blob's location and its rectangular shape. The theta rotational value shows how well the blob aligns with the cartesian coordinates of the LCD device and ranges in value from $-90°$ to $90°$. Specifically, the theta value is the angle formed by the X-axis and the blob's principal axis of inertia. The first pixel is defined as the first pixel of the blob that appeared in the connectivity test, described in greater detail above. The minimum and maximum pixels are the two pixel locations that define the smallest rectangle that completely contains the blob. The minimum pixel is the upper left hand corner of the rectangle, the maximum pixel is the lower right hand corner. The horizontal or vertical widths is the difference between the minimums and maximums horizontal or vertical coordinates, respectively.

The remaining information deals with corners, children, and siblings. Corners contains the number of the blob's exterior corners. Children contains a pointer to the blob's first child. A child of a blob is a white region which is surrounded on all sides by the blob. Sibling contains a pointer to the next sibling of the blob. To count the number of children a blob has, simply count the members of the sibling list pointed to by the blob's child.

These connectivity results can be saved on a file, printed on a label that attaches to the LCD device, or viewed from the user interface. Heuristic methods can help to indicate many types of errors, with any particular heuristic deriving from the average LCD device to be tested. Further, heuristic methods can be programmed so that error identification is automated, with the user interface allowing for human checking of the automated results.

Cross Talk is tested by analyzing the images made during Cross Talk Images 103. Cross Talk Test 201, can be performed after generation of Cross Talk Images 103. The cross talk test compares crossing regions which lie on the same row and column lines as the black displayed rectangle with background regions that lie outside those row and column lines. Any result other than conformity between those two regions indicates a cross talk error and the difference in intensities indicates the magnitude of the cross talk error. The maximum allowable cross talk error depends on the intended use of the LCD device. After completing the cross talk test, the results can be at output 140.

The present invention can also check response time. Checking for response time comprises scanning at least one pattern to produce a predetermined image. The response time pattern has at least two lines, one previously activated line and one expanding line. The previously activated line has all of its LCD pixels blackened before the start of the scan. The expanding line activates as the scan begins. The extent and degree of activation can be compared to the average LCD device results to determine the acceptability of the tested device's response time.

Figure 5:
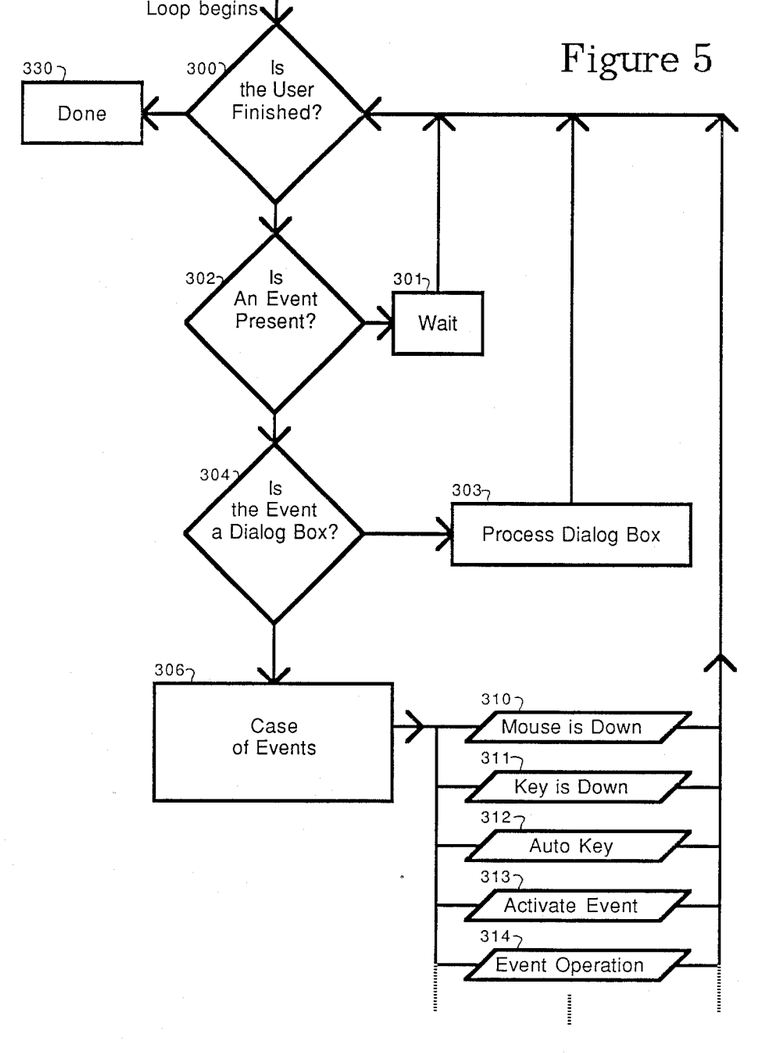
FIG. 5 is a flow chart diagram of the user interface of the present invention.

The present invention also provides a user interface that allows a user to view the various images and their associated histograms, to enlarge and reduce the images, and to set differing threshold levels. The general flow of control of the user interface of the present invention is shown in FIG. 5. In the preferred embodiment, the software of the system runs on an Apple ® Macintosh TM computer. In this computer environment, each input request generates an event. Other programs in the computer can also initiate an event. An event is a computational object that provides information concerning program control. For example, an event could be the pressing of a key on the keyboard, a request to store a file on a disk, or the results of an executed program. The operating system maintains an event queue that a program may access to determine what actions should be performed.

The first step is step 300 wherein the current status of the user is checked, and involves the computer determination whether the user has terminated the program. If the user has terminated the program, control passes to step 330 where the user is Done and execution terminates. If the user has not terminated the program, control proceeds to step 302.

Step 302 checks to see if the event queue has an event. If no event is present, the program proceeds to step 301 to wait and then start again at step 300. Note that step 301 is added to illustrate the busy-wait loop that occurs when the event queue is empty. It would be obvious to one skilled in the art, however, that no explicit step 301 is necessary in this algorithm. However, if an event is present, control proceeds to step 304.

Step 304 checks to see if the event present is a dialog box. A dialog box is a system routine that requires a user input to complete its function. Thus, if the event is a dialog box, program control goes to step 303 to process the dialog box. In effect, this performs as the operating system and deals with the current situation according to the user's input. After processing the dialog box, program control passes back to step 300. If the event is not a dialog box, then control proceeds to step 306.

Step 306 determines what program functions will occur. A variety of choices is available, including Mouse is Down 310, Key is Down 311, Auto Key 312, Activate Event 313, and Event Operation 314. Mouse is Down 310 could indicate a section of an image to be acted on, or to activate a currently inactive portion of the screen, or to activate a menu event. Key is Down 311 indicates that input has been received at the keyboard and may have significance to the program depending on its current state. Auto Key 312 is similar to Key is Down 311 having the additional occurence of a control key, called the auto key, being depressed simultaneously with the regular key. This auto key is analogous to capitalization on a conventional typewriter, with the command key held down while pressing the letter key to produce an auto key. Activate Event 313 is an internal call to activate a certain part of the interface and make it the active event. Event Operation 314 is an internal call to perform a certain operation previously specified by the user. Other cases of program events are also possible and are indicated by dotted lines extending away from the last event case, step 314. Upon completion of the program event, control passes to step 300. To terminate the program, at least one program event can send a termination signal to step 300.

Thus, an LCD error detection system is described.

What is claimed is:

1. A process for detecting faulty liquid crystal display (LCD) cells in an (LCD) device comprising the steps:
   (1) displaying a first image (image A) on said LCD device;
   (2) scanning and electronically storing said first image;
   (3) displaying a second image (image B) on said LCD device where said second image is the inverse of said first image;
   (4) scanning and electronically storing said second image;
   (5) generating a third image (image A+B) from the matrix addition of said first and second images;
   (6) selecting a threshold value to minimize processing time;
   (7) analyzing a thresholded image generated from said third image;
   (8) generating a bit map from said threshold image;
   (9) locating the position of faulty LCD cells in said LCD device after conducting a connectivity analysis on said bit map;
   (10) outputting the results of said locating step, such that the locations of said faulty LCD cells are provided.

2. The process as described in claim 1 further comprising a balancing step before said generating step wherein said first and said second images are balanced by first, calculating the lowest intensity value associated with a pixel of said images, second, calculating the highest intensity value associated with a pixel of said images and third, normalizing the contrast of said images.

3. The process as described in claim 2, wherein said step of balancing further comprises checking the purity of said LCD device by comparing the uniformity of the background intensity at various locations in said images with an average background intensity.

4. The process as described in claim 3, wherein said analyzing step further comprises using histogram analysis such that a majority of intensity values are cleared, leaving a minority of said intensity values indicating said faulty LCD cells.

5. The process as described in claim 4, wherein said locating step further comprises using a connectivity analysis, such that regions containing faulty LCD cells are determined by examining a collection of locations that have an intensity value associated with the presence of faulty LCD cells and the borders of said regions are ascertained, allowing the possibility of correcting said faulty LCD cells.

6. The process as described in claim 1, wherein further comprising producing a patterned image prior to displaying said image A, then checking cross talk by comparing the average intensity of areas of said LCD device that are directly horizontally or vertically adjacent to patterned areas of said LCD device with an average background intensity of said LCD device.

7. The process as described in claim 6, wherein said outputting step further comprises presenting an interface on a computer monitor for allowing a user to view said images by user selectable thresholding values and said user also having the ability to view histograms showing the relative frequency of intensity values in said images.

8. The process as described in claim 7, wherein said outputting step further comprises storing locations of said faulty LCD cells in a permanent storage file.

9. A liquid crystal display (LCD) error detection system comprising:

scanner means for producing electronic images of a LCD device;

LCD display driver means, coupled to said LCD device, for generating display signals to operate said LCD device;

computing means, coupled to said scanner means and said LCD display driver means, for electronically storing said images of said LCD device, performing analysis on said images to locate the position of faulty LCD cells, and outputting the results of said analysis;

said computing means coordinating operation of said scanner means and said LCD display driver means such that appropriate patterns appear on said LCD device to produce a first and second image wherein said LCD device has an inverted display for said second image.

* * * * *